United States Patent [19]
Wakita

[11] Patent Number: 5,917,751
[45] Date of Patent: Jun. 29, 1999

[54] NONVOLATILE SEMICONDUCTOR MEMORY DEVICE

[75] Inventor: Shinichi Wakita, Kumamoto, Japan

[73] Assignee: NEC Corporation, Tokyo, Japan

[21] Appl. No.: 09/052,427

[22] Filed: Mar. 31, 1998

Related U.S. Application Data

[62] Division of application No. 08/924,691, Sep. 5, 1997, Pat. No. 5,825,689.

[30] Foreign Application Priority Data

Sep. 5, 1996 [JP] Japan .................................. 8-235641

[51] Int. Cl.$^6$ .................................................. G11C 16/04
[52] U.S. Cl. .............................. 365/185.11; 365/185.18; 257/315; 257/316; 257/324
[58] Field of Search ........................ 365/185.11, 185.25, 365/185.18, 185.26; 257/315, 316, 318, 324, 326

[56] References Cited

U.S. PATENT DOCUMENTS

| | | | |
|---|---|---|---|
| 5,357,473 | 10/1994 | Mizuno et al. | 365/201 |
| 5,496,753 | 3/1996 | Sakurai et al. | 438/591 |
| 5,793,081 | 8/1998 | Tomioka et al. | 257/319 |

FOREIGN PATENT DOCUMENTS 5-258583  10/1993  Japan .

Primary Examiner—David Nelms
Assistant Examiner—Hien Nguyen

[57] ABSTRACT

A nonvolatile semiconductor memory device includes a memory cell array in which memory cells constituted by semiconductor storage elements are divided into a plurality of memory cell blocks each having a common source line and a common digit line, a peripheral circuit for addressing the memory cells and outputting data from the memory cells, a data detecting circuit for detecting, for each memory cell block, the presence/absence of a semiconductor storage element in which the threshold voltage of a transistor constituting the memory cell is the ground potential or less, and a source potential setting circuit capable of changing the source potential setting condition of each memory cell block in accordance with the detection result from the data detecting circuit.

2 Claims, 6 Drawing Sheets

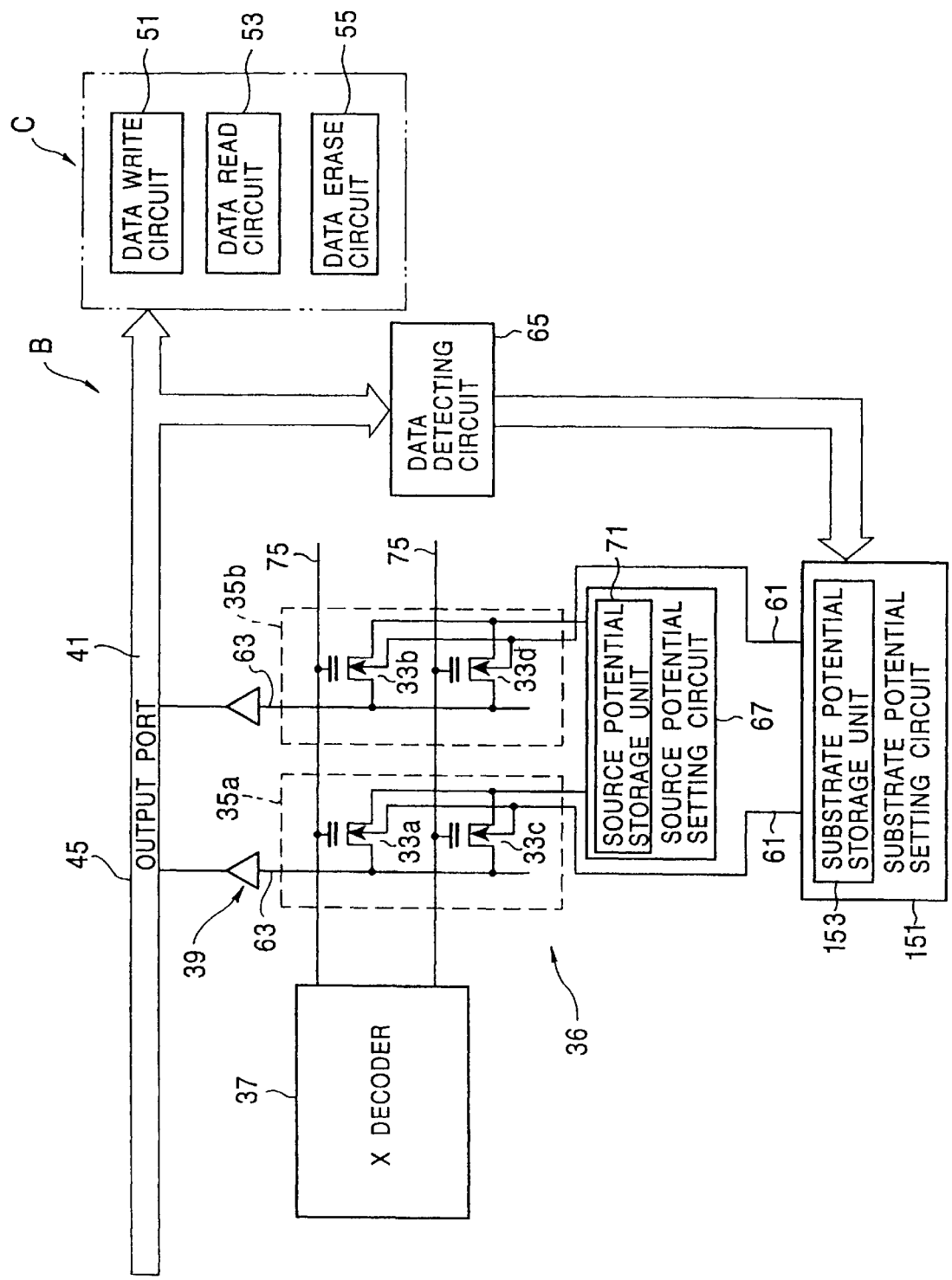

NONVOLATILE SEMICONDUCTOR MEMORY DEVICE

This application is a division of Ser. No. 08/924,691, filed Sep. 5, 1997 now U.S. Pat. No. 5,825,689.

BACKGROUND OF THE INVENTION

1. Field of the Invention

The present invention relates to a nonvolatile semiconductor memory device and, more particularly, to a nonvolatile semiconductor memory device in which stored data can be electrically rewritten.

2. Description of the Prior Art

Of electrically rewritable nonvolatile memory devices (to be referred to as EEPROMs hereinafter), a nonvolatile semiconductor memory device including storage elements constituting a large number of memory cells and having a function of simultaneously erasing these memory cells is called a flash memory. This memory device is one of storage elements currently most often used as large-capacity nonvolatile semiconductor memory devices and its market is expected to grow further in the future.

Several structures have been proposed as the structure of nonvolatile semiconductor storage elements for memory cells of this flash memory. As one representative example, a sectional view of the structure of a stack gate type storage element is shown in FIG. 1.

In this storage element, an insulating film 3 (usually an Si oxide film and called a first gate oxide film in this example) having a thickness of about 10 nm is formed on a p-type Si substrate 1. Additionally, a floating gate 5 (usually polysilicon) having a thickness of about 50 nm, an insulating film 7 (usually an Si oxide film and called a second gate oxide film in this example) having a thickness of about 20 nm, and a metal control gate 9 are stacked in this order on the first gate oxide film 3. N-type diffusion layers serving as a source 11 and a drain 15 are formed on the two sides of the gate on the substrate 1.

This general nonvolatile semiconductor storage element is used as a storage element 17 constituting one memory cell. A nonvolatile semiconductor memory device is formed by arranging a large number of these storage elements 17 in the form of arrays on the Si substrate 1.

A data write in this storage element 17 will be described below.

To write data "0" in the storage element 17, voltages of +6 V and +10 V, for example, are applied to the terminal of the drain 15 and the control gate 9, respectively, and the source 11 and the Si substrate 1 are grounded (0 V). At this time, the potential of the floating gate 5 is unconditionally determined by the capacitances of the first and second gate oxide films 3 and 7.

Under the conditions set as above, a channel formed in the surface of the Si substrate 1 immediately below the floating gate 5 is pinched off by a depletion layer 15a formed near the drain. In this depletion layer 15a, electrons and holes (to be referred to as hot electrons and hot holes, respectively, hereinafter) having high kinetic energy are generated by impact ionization.

These hot carriers have energy by which they can tunnel an energy barrier in the first gate oxide film 3. Of these hot carriers, hot electrons are accelerated by an electric field between the floating gate 5 and the depletion layer 15a and injected into the floating gate 5.

This injection of the hot electrons gradually lowers the potential of the floating gate 5. When the electric field between the floating gate 5 and the depletion layer 15a becomes zero, the hot electron injection is complete. As a result of this operation, the threshold voltage (to be referred to as the Vth hereinafter) of the transistor of a storage element A rises from about 0.5 V before the write to about 5 V. This state is defined as a state in which data "0" is written.

As described above, the operation of injecting hot electrons into the floating gate 5 of the storage element 17 constituting a memory cell and raising the Vth is called a write. When the applied voltage to the control gate 9 is returned to 0 V, the electrons stored in the control gate 9 remain in the control gate 9, and this state is held for very long periods of time. Accordingly, this element serves as a nonvolatile semiconductor storage element capable of holding stored information for long time periods even after the electrical signal is cut off.

An erase of data "0" will be described next.

To erase data "0", the control gate 9 and the Si substrate 1 of the storage element 17 are grounded (0 V), and the drain 15 is opened. A voltage of 9 V is applied to the source 11.

Under the above voltage set conditions, the potential of the floating gate 5 is unconditionally determined by the voltage set conditions.

The breakdown voltage of the p-n junction of the source 11 with respect to the Si substrate 1 is preset to about 7 V. Therefore, when the 9-V voltage is applied to the source 11, hot carriers are generated by breakdown in a depletion layer 11a near the source. Of these hot carriers, hot holes are injected into the floating gate 5 by an electric field between the floating gate 5 and the depletion layer 11a near the source.

This injection of the hot holes raises the potential of the floating gate 5. The injection is complete when the electric field between the depletion layer 11a and the floating gate 5 becomes zero. Consequently, the Vth of the memory cell drops and returns to about 0.5 V.

As described above, the operation by which hot holes are injected into the floating gate 5 of the storage element 17 of a memory cell and as a consequence the Vth drops and returns to the original voltage is called a data erase. Also, the method of erasing data by injection of hot holes as described above is particularly called hot hole injection.

Another data erase method using a current (to be referred to as an FN current hereinafter) produced by a Fowler-Noldheim tunnel will be described below.

In the data erase using an FN current, +12 V are applied to the source 11, the Si substrate 1 and the control gate 9 are grounded (0 V), and the drain 15 is opened or grounded (0 V). To erase data using an FN current, the breakdown voltage of the p-n junction between the source 11 and the Si substrate 1 is preset to 12 V or more.

In writing data "0", therefore, the potential of the floating gate 5 is negative, so a potential difference is further produced accordingly. Consequently, a strong electric field of 10 MV/cm or more is applied to the first gate oxide film 3 between the source 11 and the floating gate 5. When such a strong electric field exists, an FN current flows in the gate oxide film due to a tunnel effect. By extracting electrons stored in the floating gate 5 toward the source 11 by using this FN current, data can be erased.

Since the breakdown voltage of the p-n junction is high, 12 V or more, the generation of hot carriers need not be taken into consideration.

Of the data erase methods described above, however, even in the method using hot hole injection or an FN current, the Vth of the storage element 17 of a memory cell when data is erased and written varies to a certain degree.

FIG. 2 shows conventionally found common Vth distributions when data write and erase are performed for a plurality of storage elements 17.

In this prior art, the center of the Vth's of the storage elements 17 after erase is approximately 0.5 V as indicated by D1, and these Vth's have a distribution of about 1 V on each of high and low sides (refer to range $a_1$). Analogously, the Vth's after write center around 6 V as indicated by D2 and have a distribution of about 1 V on each side (refer to range $a_2$).

Of these Vth distributions, the variation after data erase is particularly a problem. For example, in a storage element D3, in which the Vth is 0 V (ground potential) or less (a memory cell formed by a storage element like this is called an overerased cell), of a number of storage elements shown in FIG. 2, the transistor is normally ON, so the drain current constantly flows.

Accordingly, all memory cells in a memory cell block having a common digit line with this overerased cell cannot perform reads and writes. Consequently, this nonvolatile semiconductor memory device ceases to function normally.

An overerased cell exists for the reason explained below. As shown in FIG. 2, in the data erase using hot hole injection, the Vth after data in a memory cell is erased is affected by the amount of hot holes injected into the floating gate 5 within a predetermined period during the data erase. This hot hole injection amount is determined by the electric field between the floating gate 5 and the depletion layer 15a near the drain during the data erase. Therefore, if the electric field between the floating gate 5 and the depletion layer 11a near the source differs from one memory cell to another, the Vth during data erase also varies from one memory cell to another.

The potential of the floating gate is determined by the thicknesses and dielectric constants of the first and second gate oxide films 3 and 7, and by the potentials of the control gate 9, the source 11, and the Si substrate 1. Therefore, if the thickness of the gate oxide film or the overlap between the gate and the source differs from one storage element 17 to another, the potential of the floating gate 5 also varies. This produces a difference in the electric field between the floating gate 5 and the depletion layer 15a near the source. Consequently, the charge extraction amount varies to produce a variation in the Vth's of the storage elements 17 of individual memory cells.

On the other hand, in the data write using an FN current, electric charge extracted from the floating gate 5 to the source 11 is similarly influenced by the electric field between the floating gate 5 and the depletion layer 11a near the source. This results in a variation in the Vth's of storage elements of memory cells.

As a first method of solving the above problem, efforts are being made to uniformize the physical structures of the storage elements 17 constituting individual memory cells, i.e., minimize the thicknesses of the first and second gate oxide films 3 and 7 and the overlap between the source and the gate by improving the process techniques and the like. However, as the transistors constituting memory cells shrink further, the thicknesses of gate oxide films continue to decrease while the capacities of memories continue to increase. Consequently, some measure other than the above measure is being required.

To solve the above problems, several measures have been proposed.

As an example, Japanese Unexamined Patent Publication No. 5-258583 has disclosed a method by which an overerased cell is eliminated by applying a voltage of 14 V (a voltage higher than 12 V as a normal erase voltage is chosen) to the sources of a plurality of memory cells from which data is to be erased (in the disclosed method, −14 V are applied to the control gates), and then applying a high voltage of −14 V to the sources (in the disclosed method, +14 V are applied to the control gates).

In this method, even if storage elements after erase have a variation in the Vth's (even if an overerased cell exists), the electric field between the floating gate 5 and the depletion layer 11a near the source is increased in this overerased cell when a high voltage of −14 V is later applied. Since this increases the electric charge amount extracted from the floating gate 5, the Vth's of the storage elements 17 constituting memory cells can be finally made uniform.

Unfortunately, when the above method is used it is necessary to continuously apply positive and negative high-voltage pulses twice in a data erase. This not only complicates the data erase but also prolongs the erase time. Additionally, since the positive and negative high-voltage pulses must be continuously applied, the gate insulating film or the like readily fatigues. Therefore, it has been pointed out that the reliability of a memory operation impairs or the life as a storage element shortens.

Furthermore, the above complicated operation must be equally performed for all memory cells because not so many overerased cells exist among a very large number of memory cells.

SUMMARY OF THE INVENTION

The present invention has been made in consideration of the above situation and has as its object to provide a novel nonvolatile semiconductor memory device which is well usable even if manufacturing variations are present between a plurality of storage elements arranged on a substrate and which obviates the need for an operation of continuously applying high-voltage pulses in order to eliminate overerased cells.

To achieve the above object, according to the principal object of the present invention, there is provided a nonvolatile semiconductor memory device including a plurality of semiconductor storage elements each having a source, a drain, and a floating gate and a control gate formed between the source and the drain, and capable of electrically writing data and simultaneously erasing written data, comprising a memory cell array in which memory cells constituted by the plurality of semiconductor storage elements are divided into a plurality of memory cell blocks each having a common source line and a common digit line, a peripheral circuit for addressing the memory cells and outputting data from the memory cells, a data detecting circuit for detecting, for each memory cell block, the presence/absence of such a semiconductor storage element as a threshold voltage of a transistor constituting the memory cell is a ground potential or less, and a source potential setting circuit capable of changing a source potential setting condition of each memory cell block in accordance with a detection result from the data detecting circuit.

In the nonvolatile semiconductor memory device of the above principal aspect, the data detecting circuit detects the presence/absence of an overerased cell. In accordance with the detection result, the source potential can be changed (usually raised).

Also, since the data detecting circuit is provided in the nonvolatile semiconductor memory device, it is possible to set an optimum source potential suited to an environment in which the nonvolatile semiconductor memory device is actually used.

According to the second aspect of the present invention, in the nonvolatile semiconductor memory device of the above principal aspect, the digit lines are connected to the data detecting circuit, the source lines are connected to the source potential setting circuit, and when the data detecting circuit detects data "1" in output data from the digit lines after setting word lines connected to a decoder constituting a part of the peripheral circuit to the ground potential, the data detecting circuit raises a source potential set by the source potential setting circuit for a memory cell block having a source line corresponding to the digit line, and, when detecting data "0", the data detecting circuit fixes the source potential.

In the nonvolatile semiconductor memory device of the above second aspect, the data detecting circuit detects the presence/absence of an overerased cell. If an overerased cell exists, the source potential of the corresponding memory cell is changed (usually raised) to increase the Vth. If no overerased cell exists, the source potential of the corresponding memory block is fixed without being changed. Consequently, overerased cells in memory cells can be eliminated.

According to the third aspect of the present invention, the nonvolatile semiconductor memory device of the above principal aspect further comprises a source potential setting circuit capable of detecting a signal from the data detecting circuit, which is generated when an operating state of the nonvolatile semiconductor memory device changes, and setting a source potential of a transistor in the memory cell to an arbitrary potential in accordance with detection of the signal.

In the nonvolatile semiconductor memory device of the above third aspect, a signal from the data detecting circuit changes in accordance with the operating state of the nonvolatile semiconductor memory device. However, the source potential can be set to an arbitrary value in accordance with the changing signal.

According to the fourth aspect of the present invention, in the nonvolatile semiconductor memory device of the above principal aspect, the source potential setting circuit comprises a source potential storage unit for storing values of source potentials set for the memory cell blocks by the source potential setting circuit.

In the nonvolatile semiconductor memory device of the above fourth aspect, the source potential storage unit fixes the source potential or previously adjusts the source potential in accordance with the operating environment of the nonvolatile semiconductor memory device. Accordingly, the source potential can be set in accordance with the operating environment of the nonvolatile semiconductor memory device.

According to the fifth aspect of the present invention, in the nonvolatile semiconductor memory device of the above fourth aspect, the source potential storage unit has means for storing the values of source potentials set for the memory cell blocks by the source potential setting circuit.

In the nonvolatile semiconductor memory device of the above fifth aspect, the set value of the source potential can be changed at any time in accordance with a change in the operating environment.

According to the sixth aspect of the present invention, in the nonvolatile semiconductor memory device of the above principal aspect, the data detecting circuit is provided in an external PROM program device arranged separately from the nonvolatile semiconductor memory device.

In the nonvolatile semiconductor memory device of the above sixth aspect, the data detecting circuit is arranged in the PROM program device rather than in the nonvolatile semiconductor memory device. This decreases the size of the nonvolatile semiconductor memory device itself.

According to the seventh aspect of the present invention, there is provided a nonvolatile semiconductor memory device including a plurality of semiconductor storage elements, each comprising a structure such that: a diffusion layer having a second conductivity type different from a first conductivity type of a semiconductor substrate is formed in the semiconductor substrate as a drain and a source of a transistor constituting a memory cell; that a charge storage layer is formed on the semiconductor substrate via an insulating layer; that a control gate is formed on the semiconductor substrate via the charge storage layer and an insulating layer; that a first well layer having the first conductivity type and so formed as to surround the semiconductor storage element and a second well layer having the second conductivity type and so formed as to surround the first well layer are provided between the semiconductor storage element and the semiconductor substrate; and that a substrate potential setting circuit capable of changing a potential of the first well layer is formed in the first well layer.

In the nonvolatile semiconductor memory device of the above seventh aspect, the substrate potential of the nonvolatile semiconductor storage element can be set to an arbitrary value independently of other storage elements by changing the potential of the first well layer.

According to the eighth aspect of the present invention, it is possible to use the semiconductor storage element described in the seventh aspect instead of the semiconductor storage element of the principal aspect and the substrate potential setting circuit described in the seventh aspect instead of the source potential setting circuit of the principal aspect.

In the nonvolatile semiconductor memory device of the above eighth aspect, as in the nonvolatile semiconductor memory devices described in the principal aspect to the fifth aspect, it is possible to detect an overerased cell and change and set the threshold voltage of the semiconductor storage element in accordance with the detection result.

The nonvolatile semiconductor memory devices according to the above aspects of the present invention achieve the following effects.

That is, in the nonvolatile semiconductor memory device described in the principal aspect, the data detecting circuit is provided for each memory cell block. Therefore, a memory cell block having an overerased cell can be easily detected. Additionally, it is possible to change the source potential of each memory cell block in accordance with the detection result and allow the nonvolatile semiconductor memory device to normally operate. Also, since this nonvolatile semiconductor memory device includes the source potential setting circuit for fixing the source potential, overerased cells can be eliminated.

In the nonvolatile semiconductor memory device described in the second aspect, the data detecting circuit is constituted by a simple circuit for discriminating between "0" and "1" of output data from the digit lines. Accordingly, the same effects as described in the principal aspect can be obtained with a simple arrangement.

In the nonvolatile semiconductor memory device described in the third aspect, it is possible to receive a signal from the data detecting circuit in accordance with a change in the operating state of the nonvolatile semiconductor memory device and change the set values in the source potential setting circuit. Therefore, the operation of the nonvolatile semiconductor memory device can be accurately performed in accordance with a change in the operating state.

In the nonvolatile semiconductor memory device described in the fourth aspect, the set source potential can be stored for each memory cell block. Therefore, overerased cells can be reliably eliminated.

In the nonvolatile semiconductor memory device described in the fifth aspect, the storage unit described in the third aspect can change stored information at any time. Therefore, the setting of the source potentials can be changed in accordance with a change in the operating environment in which the nonvolatile semiconductor memory device is used. Consequently, even if a semiconductor storage element changes its characteristics due to a change in the operating environment, it is possible to allow the nonvolatile semiconductor memory device to normally operate.

In the nonvolatile semiconductor memory device described in the sixth aspect, the data detecting circuit is provided in the external PROM program device rather than in the nonvolatile semiconductor memory device and connectable to the nonvolatile semiconductor memory device. Accordingly, the data detecting circuit can be connected to the PROM program device only while simultaneous data erase and data write are performed and disconnected in a normal operation state, i.e., when the nonvolatile semiconductor memory device is used as a read-only memory. Consequently, the size of the nonvolatile semiconductor memory device itself can be decreased.

In the nonvolatile semiconductor memory device described in the seventh aspect, the substrate potential of a nonvolatile semiconductor storage element constituting a memory cell can be changed while the storage element is electrically independent of other adjacent nonvolatile semiconductor storage elements. Consequently, the Vth can be changed independently of the other adjacent elements.

In the nonvolatile semiconductor memory device described in the eighth aspect, the nonvolatile semiconductor storage element described in the above seventh aspect is used as an element constituting a memory cell. Therefore, the Vth can be changed independently of the source potential. As a consequence, overerased cells can be eliminated independently of the source potential.

In the nonvolatile semiconductor memory devices of the present invention described above, overerased cells can be eliminated more easily than in conventional nonvolatile semiconductor memory devices. This facilitates making the nonvolatile semiconductor memory devices normally operate.

Additionally, no extra write or the like is necessary, and it is also unnecessary to apply a higher voltage than usual in order to detect and eliminate an overerased cell. This eliminates the conventional problem that the life of a memory cell or the like shortens in association with the problem of overerased cells.

The above and many other objects, features and advantages of the present invention will become manifest to those skilled in the art upon making reference to the following detailed description and accompanying drawings in which preferred embodiments incorporating the principles of the present invention are shown by way of illustrative example.

BRIEF DESCRIPTION OF THE DRAWINGS

FIG. 7 is a block diagram of the third embodiment of the present invention using the semiconductor storage element shown in FIG. 6.

DETAILED DESCRIPTION OF THE PREFERRED EMBODIMENTS

Several preferred embodiments of the present invention will be described below with reference to the accompanying drawings.

Figure 3:
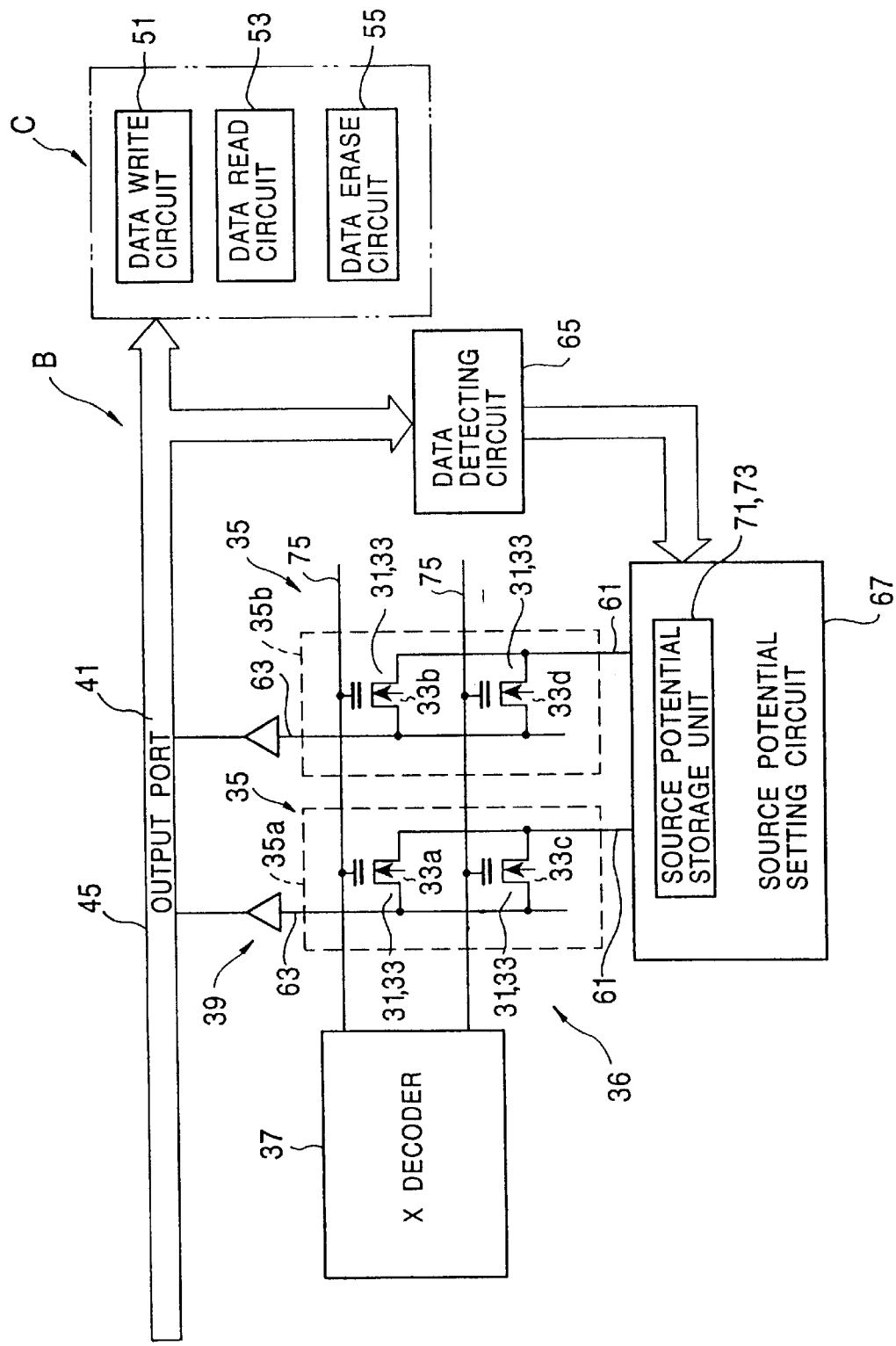
FIG. 3 is a block diagram of the first embodiment of the present invention.

FIG. 3 is a block diagram of a nonvolatile semiconductor memory device showing the first embodiment of the present invention.

Similar to a common flash memory, a nonvolatile semiconductor memory device B substantially includes a memory cell array 35 in which a large number of memory cells 33 constituted by a large number of nonvolatile semiconductor storage elements 31 are arranged in the form of arrays, and a peripheral circuit 36 arranged around the memory cell array 35. This peripheral circuit 36 includes an X decoder 37 for addressing the memory cells, a sense amplifier block 39 in which sense amplifiers for amplifying and checking cell data are arranged, a data bus 41 for transmitting the data from the sense amplifiers, and an output port 45 for outputting the data.

The nonvolatile semiconductor storage elements 31 constituting this nonvolatile semiconductor memory device have a structure similar to a conventional structure (shown in FIG. 1), so a detailed description thereof will be omitted.

The output data from the output port 45 is supplied to a PROM program device C arranged outside the nonvolatile semiconductor memory device B.

This PROM program device C is analogous to a conventional device and roughly divided into a memory cell data write circuit 51, a data read circuit 53, and a data erase circuit 55.

The PROM program device C functions to write data into, read data from, and simultaneously erase data in the nonvolatile semiconductor memory device B.

In the nonvolatile semiconductor memory device B according to the present invention, the memory cell array 35 is divided into a plurality of memory cell blocks 35a, 35b, . . . , each having a common source line 61 and a common digit line 63.

A data detecting circuit 65 for detecting the presence/absence of a memory cell constituted by a semiconductor storage element whose threshold voltage is the ground potential or lower is connected to these memory cell blocks 35a, 35b, . . . , via the digit lines 63, the sense amplifier block 39, the data bus 41, and the output port 45.

Additionally, the source lines 61 of the memory cell blocks 35a, 35b, . . . , are connected to a source potential setting circuit 67 capable of changing the source potential set conditions of the memory cell blocks 35a, 35b, . . . , in accordance with the detection result from the data detecting circuit 65.

Also, the source potential setting circuit 67 incorporates a source potential storage unit 71 for storing the set values of source potentials of the individual memory cell blocks 35, 35a, 35b, . . . .

This source potential storage unit 71 is constituted by a shift register circuit 73 for storing the source potential values set for the individual memory cell blocks by the source potential setting circuit 67.

The operations of the nonvolatile semiconductor memory device of the above first embodiment will be described below.

Figure 4:
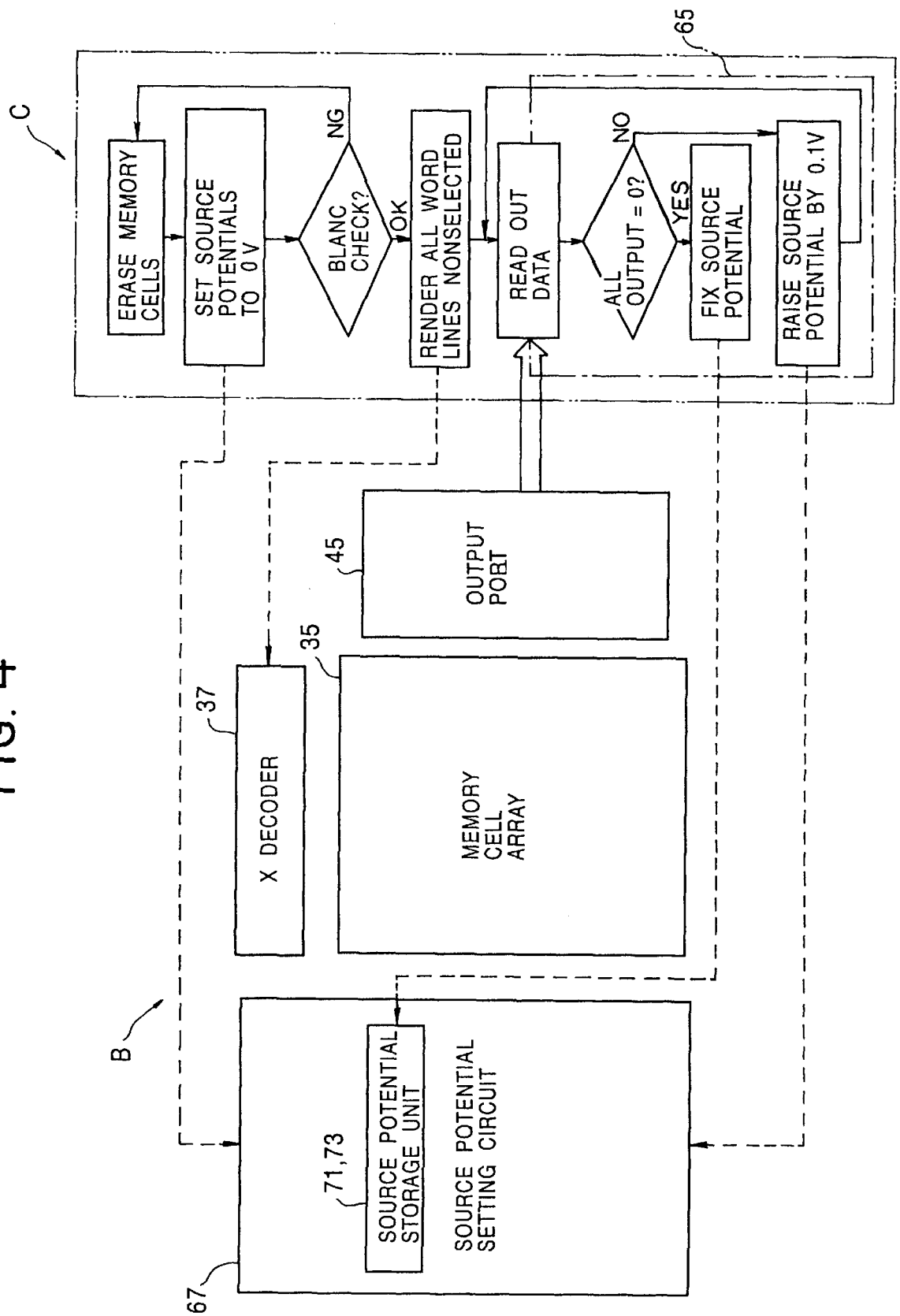
FIG. 4 is a flow chart for explaining operations of a data detecting circuit provided in the first embodiment of the present invention and a PROM program device connected to the data detecting circuit.

FIG. 4 is a flow chart showing the outline of operations of the nonvolatile semiconductor memory device and the PROM program device C.

First, under the control of the PROM program device C, data in all of the memory cells 33 constituting the memory cell array 35 of the nonvolatile semiconductor memory device B is erased. This erase is done by a method using hot hole injection or an FN current as in the prior arts described earlier.

Figure 1:
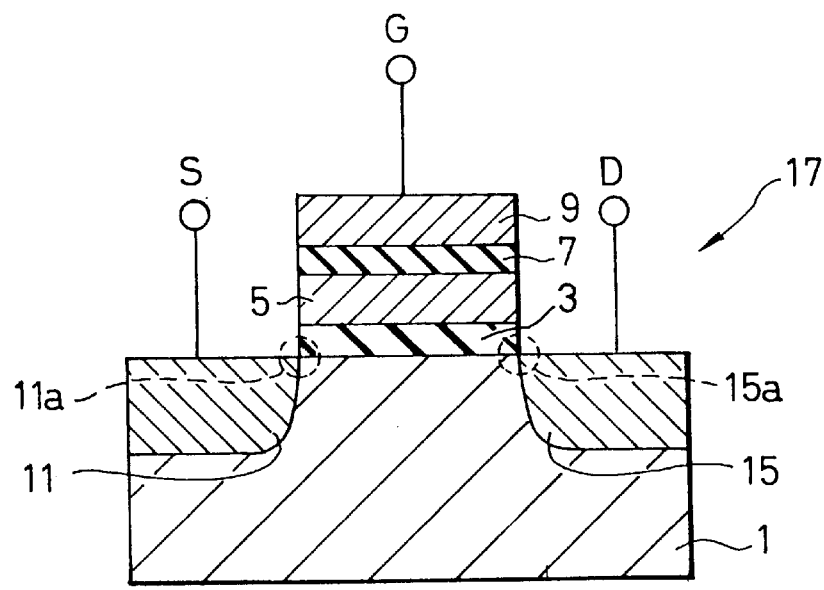
FIG. 1 is a sectional view of a stack gate type storage element as one prior art.
Figure 2:
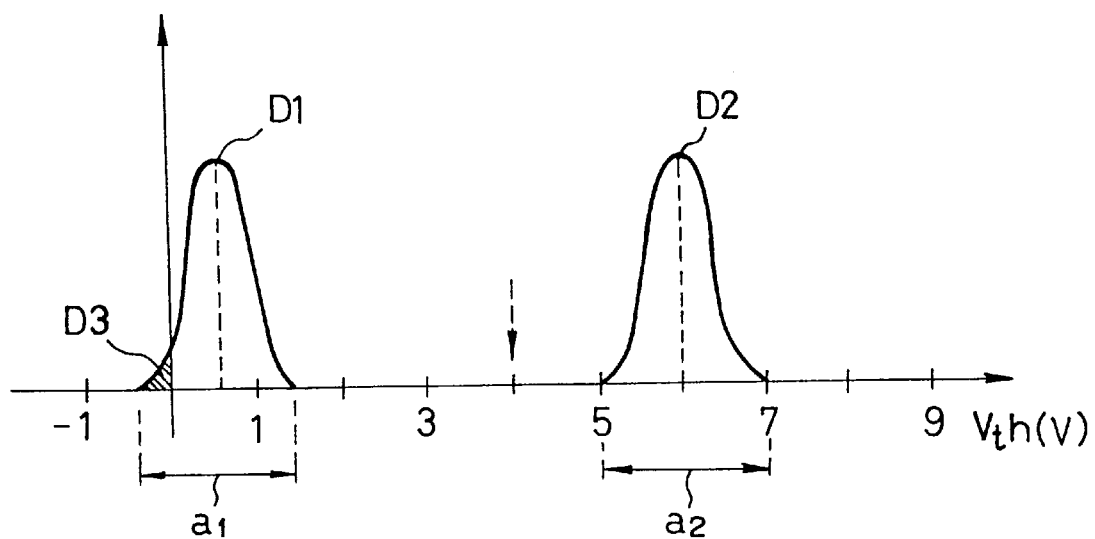
FIG. 2 is a graph showing Vth distributions when data is written and erased by using a conventional nonvolatile semiconductor memory device.

As in the case shown in FIG. 1, therefore, a Vth distribution is produced between the memory cells 33, and overerased cells whose Vth's are 0 V or less also exist.

Subsequently, whether the data in the memory cells 33 is reliably erased by the above erase is checked, i.e., a so-called blank check is performed.

To read out data in the blank check, all memory cells and the substrate potential are set to 0 V. In this case, no substrate bias is applied to the memory cells.

The potential of word lines 75 as outputs from the X decoder 37 is set to 5 V. In this state, the Vth's of all of the memory cells 33a, 33b, 33c, and 33d are the potential (5 V) of the word lines 75 or lower. Therefore, all the memory cells must be turned on and data "1" must be output from the output port 45.

If the Vth of a certain memory cell has not shifted to 5 V or less, the blank check does not terminate normally. Therefore, the above erase step is continued.

That is, this blank check is to check the maximum value of the Vth's of the memory cells after the erase step (to confirm that there is no cell whose Vth is 5 V or more).

If the result of the blank check is a normal one, the presence/absence of overerased cells is checked.

More specifically, all addresses in the X decoder 37 are rendered nonselected, i.e., the word lines 75 are set at the ground potential (0 V), under the control of the PROM program device C. When the sense amplifier block 39 is operated in this state, the memory cell block 35a, i.e., the sense amplifier 39a for checking data in a digit line 63a to which the memory cells 33a and 33c are connected outputs data "0" because all of the connected memory cells are OFF.

On the other hand, the memory cell block 35b, i.e., the sense amplifier 39b for checking data in a digit line 63b to which the memory cells 33b and 33d are connected outputs data "1" because the Vth of the memory cell 33d is lower than 0 V. This is so because the memory cell 33d is ON.

The data detecting circuit 63 includes a multi-input OR circuit. Therefore, when the data detecting circuit 65 checks the output data from the output port 45, if at least one "1" exists in the data, the OR circuit outputs "1". The OR circuit outputs "0" only when the outputs from all cells are "0". Accordingly, if even one overerased cell exists in a memory cell block, the output data is necessarily "1". When all overerased cells are completely eliminated, the output data becomes "0". This extremely facilitates the determination of the presence/absence of an overerased cell. This data detection result is transmitted as a signal of "1" or "0" to the source potential setting circuit 67.

In accordance with the information from the data detecting circuit 65, the source voltage setting circuit 67 raises the source potential of the memory cell block 35b in which the overerased cell 33d exists by 0.1 V. That is, the basic operation of the source potential setting circuit is to change or fix the source potential and can be easily accomplished by a circuit including a common variable power supply.

As a consequence, a substrate bias effect is applied to the memory cells 33b and 33d in the memory cell block 35b, and the Vth's of these memory cells 33b and 33d rise to −0.4 V and 0.6 V, respectively.

The Vth herein mentioned is the potential difference between the control gate and the source of a memory cell. As the potential difference between the substrate potential (0 V) and the control gate, a memory cell is turned on when the potential difference is −0.3 V and 0.7 V.

Since the Vth of the memory cell 33d is 0 V or less in this state, the sense amplifier 39b to which the memory cell block 35b is connected outputs data "1".

Accordingly, the flow returns to the step of raising the source potential by 0.1 V by the data detecting circuit 65, and the Vth of the memory cell again rises in 0.1-V increments.

When this flow is repeated several times and consequently the Vth of the memory cell 33d equals the potential of the word line 75, i.e., 0 V as the potential difference between the control gate and the substrate, the output from the sense amplifier is inverted to "0". At this time, the data detecting circuit 65 instructs the source potential storage unit 71 in the source potential setting circuit 67 to fix the source potential to that value.

Note that the source potential storage unit 71 adds to the source potential at that point a margin for preventing an operation error caused by a characteristic fluctuation in, e.g., a semiconductor storage element arising from a change in the operating environment (e.g., the environmental temperature) of the nonvolatile semiconductor memory device B, and thereby finally fixes the source potential. For example, in a memory cell whose Vth is 0 V, a transistor can be turned on or off due to an environmental fluctuation. Therefore, the source potential is fixed after a certain margin is added to it.

By the result of the above operation, overerased cells are eliminated and all memory cells function as normal memory cells.

In this nonvolatile semiconductor memory device B, the source potential setting circuit 67 incorporates a register circuit as the source potential storage unit. Therefore, the set source potentials can be stored for an arbitrary period.

In a structure like this, an operation of detecting an overerased cell and setting the source potential at an arbitrary potential is performed whenever the operating environment changes, e.g., whenever the IC memory is switched on or reset or the operation program branches. Consequently, the Vth of an overerased cell can be set at a given potential following this change in the operating environment.

It is also possible to allow the data detecting circuit 65 to detect a signal generated when the operating state of the nonvolatile semiconductor memory device changes. In synchronism with the detection of this signal, the source potential of a memory cell transistor can be set to an arbitrary value by the source potential setting circuit 67, and subsequently the flow can proceed to a memory cell data read.

Figure 5:
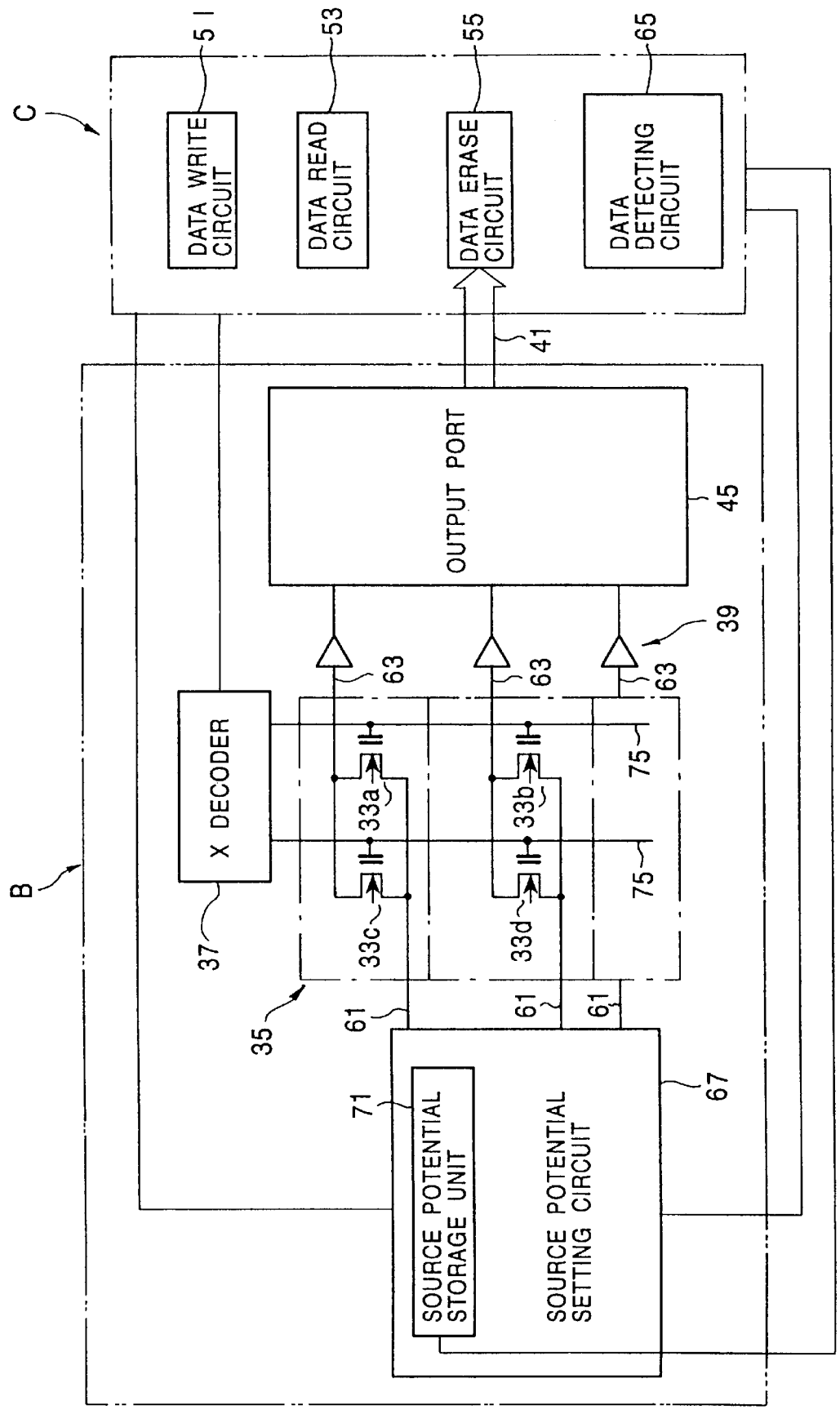
FIG. 5 is a block diagram of the second embodiment of the present invention.

The second embodiment of the nonvolatile semiconductor memory device of the present invention will be described below. FIG. 5 shows this nonvolatile semiconductor memory device which is substantially identical with the nonvolatile semiconductor memory device of the first embodiment.

In FIG. 5, the same reference numerals as in FIG. 3 denote the same parts, and a detailed description thereof will be omitted. This second embodiment differs from the first embodiment in that a data detecting circuit 65 is arranged in a PROM program device C rather than in a nonvolatile semiconductor memory device B.

Another difference is that a source potential storage unit 71 in a source potential setting circuit 67 is not a random access memory but has a RROM cell structure which is programmable but, after information is once stored, normally used as a read-only memory without changing the stored information.

The operations of the nonvolatile semiconductor memory device of the second embodiment will be described below.

First, after the PROM program device C is connected to the nonvolatile semiconductor memory device B, data erase and blank check are performed for a memory cell array 35 in the same manner as explained in the operation of the nonvolatile semiconductor memory device of the first embodiment.

Subsequently, the presence/absence of an overerased cell is checked. The source potential of a memory block cell connected to a digit line where an overerased cell exists is raised in increments of, e.g., 0.1 V, thereby effectively increasing the Vth. This operation is also he same as in the first embodiment.

When overerased cells are eliminated after the operation is repeatedly performed, the data detecting circuit 65 instructs the source potential storage unit 71 in the source potential setting circuit 67 to fix the source potential. The source potential storage unit 71 fixes the source potential by adding to the source potential at that time a margin assuming a change in the operating environment of the nonvolatile semiconductor memory device B. With this operation, overerased cells are eliminated and all memory cells operate normally.

In the second embodiment, the data detecting circuit 65 is incorporated into the PROM program device C. When the above operation is complete, the data detecting circuit 65 is disconnected together with the PROM program device C from the nonvolatile semiconductor memory device B.

The source potential storage unit 71 has a PROM cell structure. After the source potentials are once determined and the set values for individual memory cell blocks are stored, these source potentials are not changed unless the PROM program device C is again connected to the nonvolatile semiconductor memory device B to rewrite data due to, e.g., a change in the program.

Compared to the nonvolatile semiconductor memory device of the first embodiment, therefore, the nonvolatile semiconductor memory device of the second embodiment sometimes requires performing the above operation again when the operating environment changes (e.g., when there is a temperature rise which largely changes the characteristics of storage elements). However, the structure of the nonvolatile semiconductor memory device B itself can be advantageously simplified.

In the above second embodiment, a PROM cell structure is used as the source potential storage unit 71. However, a trimmed polysilicon fuse can also be used.

In the first and second embodiments described above, a memory cell structure (the stprioure explained in the prior art shown in FIG. 1) formed on the same substrate as a known Si MOSFET structure is used as a semiconductor memory element constituting a memory cell, and an effective Vth is changed by resetting the source potential.

Alternatively, the Vth can be changed by changing the substrate potential without changing the source potential.

Figure 6:
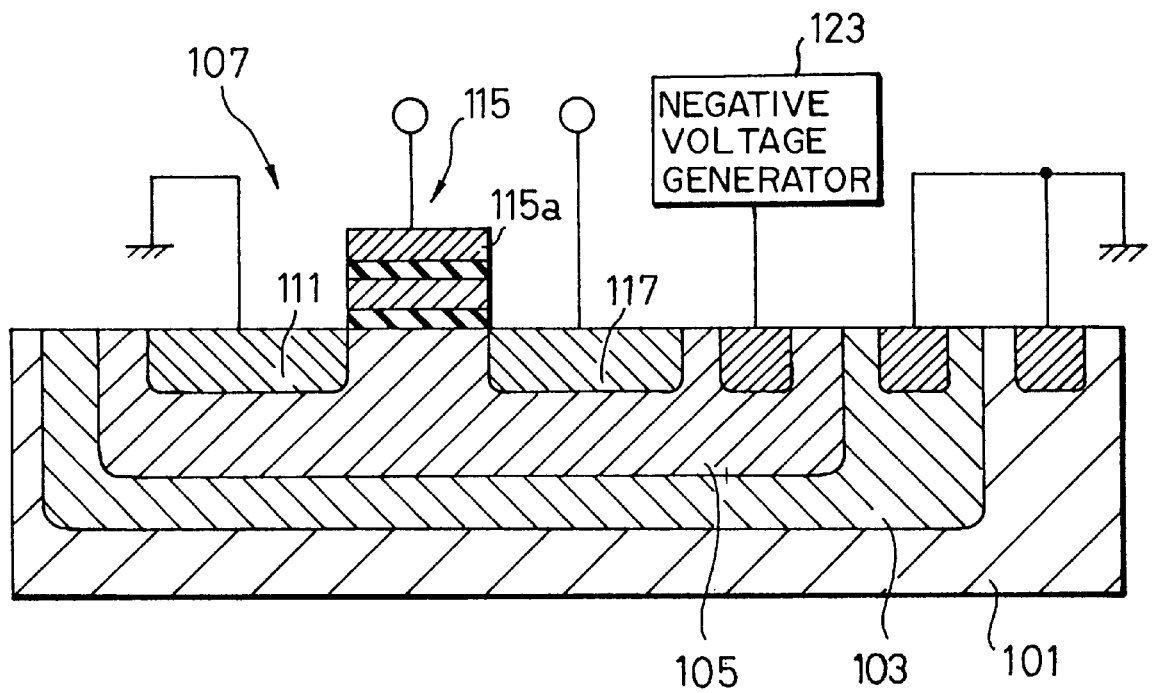
FIG. 6 is a sectional view of a semiconductor storage element used in the third embodiment of the present invention.

FIG. 6 shows a portion of the third embodiment based on the above concept. FIG. 6 is a sectional view of a novel memory cell nonvolatile semiconductor storage element capable of applying a substrate bias.

In this structure, an n-type well 103 is formed in the surface of a p-type semiconductor Si substrate 101, and a p-type well 105 is formed in the surface of the n-type well 103.

In this p-type well 105, an n-type transistor 107 constituting a memory cell is formed. This n-type transistor 107 has the same structure as the conventional n-type transistor shown in FIG. 1, i.e., includes a source 111, a gate 115, and a drain 117.

The p-type Si substrate 101 and the n-type well 103 are set at the ground potential (0 V). A negative voltage generator 123 is connected to the p-type well 105. The source 111 is grounded (0 V), a control gate 115a is connected to an X decoder, and the drain 117 is connected to a digit line.

The negative voltage generator 123 can apply an arbitrary voltage of 0 V or less.

To apply a substrate bias to a memory cell with this structure, the negative voltage generator 123 is used to generate a voltage of 0 V or less and set the potential of the p-type well 105 corresponding to the substrate of the memory cell at 0 V or less, thereby producing a potential difference from the source 111. Consequently, the Vth of the n-type transistor 107 can be raised.

Additionally, the n-type well 103 is interposed between the p-type well 105 and the p-type substrate. Therefore, the p-type well 105 corresponding to the Si substrate of the memory cell can be electrically isolated from the other adjacent elements (e.g., the memory cell and the transistor). Consequently, it is possible to apply arbitrary substrate biases to individual memory cells to control their Vth's independently of each other.

FIG. 7 is a circuit diagram of a nonvolatile semiconductor memory device as the third embodiment of the present invention when the memory cell nonvolatile semiconductor storage element structure shown in FIG. 6 is used.

The same reference numerals as in FIG. 3 denote the same parts in FIG. 7, and a detailed description thereof will be omitted.

FIGS. 7 has substantially the same configuration as FIG. 3 except that the source potentials are not changed nor set by the source potential setting circuit, i.e., the substrate potentials of individual memory cells are independently changed and set by a signal from a substrate potential setting circuit 151 (which includes the negative voltage generator described above, changes the substrate potential in accordance with the detection result from a data detecting circuit 65, and, when an overerased cell is eliminated, stores the corresponding substrate potential and fixes that potential).

In a nonvolatile semiconductor memory device B with the above configuration, it is possible to eliminate overerased cells and allow the nonvolatile semiconductor memory device to normally operate by the same operation as in the nonvolatile semiconductor memory devices of the first and second embodiments.

That is, the data detecting circuit 65 checks the presence/absence of an overerased cell. If an overerased cell is found, the substrate potential setting circuit 151 raises the substrate potential, in increments of, e.g., 0.1 V, of a memory cell block where the overerased cell is found. The substrate potential setting circuit 151 incorporates a substrate potential storage unit 153 for storing the substrate potential.

When the above check operation is repeated, the Vth of the overerased cell gradually rises, and eventually the overerased cell is eliminated. This is the same as in the first and second embodiments.

This nonvolatile semiconductor memory device is provided with a mechanism for changing the potential of the substrate independently of the source potential. Therefore, even when it is unwanted to change the source potential such as in a date erase, the substrate potential can be advantageously set independently of the source potential.

As has been described above, after any overerased cells are eliminated as above, the nonvolatile semiconductor memory device B of any of the first to third embodiments is incorporated as a large-capacity storage medium into an electronic apparatus or an IC card and operated as a flash memory in the same manner as conventional nonvolatile semiconductor memory devices.

What we claim is:

1. A nonvolatile semiconductor memory device including a plurality of semiconductor storage elements, each comprising a structure such that: a diffusion layer having a second conductivity type different from a first conductivity type of a semiconductor substrate is formed in said semiconductor substrate as a drain and a source of a transistor constituting a memory cell; that a charge storage layer is formed on said semiconductor substrate via an insulating layer; that a control gate is formed on said semiconductor substrate via said charge storage layer and an insulating layer; that a first well layer having the first conductivity type and so formed as to surround said semiconductor storage element and a second well layer having the second conductivity type and so formed as to surround said first well layer are provided between said semiconductor storage element and said semiconductor substrate; and that a substrate potential setting circuit capable of changing a potential of said first well layer is formed in said first well layer.

2. A nonvolatile semiconductor memory device, which is capable of electrically writing data and simultaneously erasing written data and which includes a plurality of semiconductor storage elements each having a structure such that a diffusion layer having a second conductive type different from a first conductive type of a semiconductor substrate is formed in said semiconductor substrate as a drain and a source of a transistor constituting a memory cell, that a charge storage layer is formed on said semiconductor substrate by the interposition of an insulating layer, that a control gate is formed on said semiconductor substrate by the interposition of of said charge storage layer and an insulating layer, and that a first well layer having the first conductive type and so formed as to surround said semiconductor storage element and a second well layer having the second conductive type and so formed as to surround said first well layer are provided between said semiconductor storage element and said semiconductor substrate, comprising:

a memory cell array in which memory cells constituted by said plurality of semiconductor storage elements are divided into a plurarity of memory cell blocks each having a common source line and a common digit line;

a peripheral circuit for addressing said memory cells and outputting data from said memory cells;

a data detecting circuit for detecting, for each memory cell block, the presence/absence of such a semiconductor storage element that a threshold voltage of a transistor constituting said memory cell is ground potential or less; and a substrate potential setting circuit capable of changing a substrate potential of each memory cell block in accordance with a detection result from said data detecting circuit.

\* \* \* \* \*